(12) United States Patent
Saitou et al.

(10) Patent No.: US 8,237,258 B2
(45) Date of Patent: Aug. 7, 2012

(54) SEMICONDUCTOR MODULE INCLUDING A SEMICONDUCTOR DEVICE, A DEVICE MOUNTING BOARD, AND A PROTECTING LAYER THEREBETWEEN

(75) Inventors: Kouichi Saitou, Ogaki (JP); Yoshio Okayama, Gifu (JP); Yasuyuki Yanase, Gifu (JP); Takahiro Fujii, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 261 days.

(21) Appl. No.: 12/394,721

(22) Filed: Feb. 27, 2009

(65) Prior Publication Data

US 2009/0218686 A1  Sep. 3, 2009

(30) Foreign Application Priority Data

Feb. 29, 2008 (JP) .................. 2008-049715
Feb. 9, 2009 (JP) .................. 2009-027741

(51) Int. Cl.
*H01L 23/485* (2006.01)

(52) U.S. Cl. ........ 257/693; 257/737; 257/775; 257/781; 257/E23.022

(58) Field of Classification Search .................. 257/694, 257/E23.022
See application file for complete search history.

(56) References Cited

U.S. PATENT DOCUMENTS 4,272,561 A * 6/1981 Rothman et al. ............. 438/570
7,808,114 B2 10/2010 Usui et al.

2002/0056901 A1 5/2002 Ono et al.
2007/0284755 A1* 12/2007 Nomoto et al. ............... 257/774
2009/0250251 A1 10/2009 Shibata et al.

FOREIGN PATENT DOCUMENTS

| JP | 09-289264 | 11/1997 |
|---|---|---|
| JP | 2000-068641 | 3/2000 |
| JP | 2000-164623 A | 6/2000 |
| JP | 2001-007252 | 1/2001 |
| JP | 2006-310530 A | 11/2006 |
| JP | 2007-109965 | 4/2007 |
| WO | WO 2007/063954 A1 | 6/2007 |

OTHER PUBLICATIONS

Japanese Notification of Reasons for Refusal, with English Translation, issued in Japanese Patent Application No. 2009-027741, dated May 18, 2010.
Japanese Office Action, with English translation thereof, issued in Japanese Patent Application No. 2010-163147, dated Apr. 26, 2011.

* cited by examiner

*Primary Examiner* — Stephen W Smoot
(74) *Attorney, Agent, or Firm* — McDermott Will & Emery LLP

(57) ABSTRACT

A semiconductor module includes a device mounting board and a semiconductor device mounted on the device mounting board. The device mounting board includes an insulating resin layer, a wiring layer provided on one main surface of the insulating resin layer, and bump electrodes, electrically connected to the wiring layer, which are protruded from the wiring layer toward the insulating resin layer. The semiconductor device has device electrodes which are disposed counter to a semiconductor substrate and the bump electrodes, respectively. The surface of a metallic layer provided on the device electrode lies on the same plane as the surface of a protective layer.

9 Claims, 13 Drawing Sheets

SEMICONDUCTOR MODULE INCLUDING A SEMICONDUCTOR DEVICE, A DEVICE MOUNTING BOARD, AND A PROTECTING LAYER THEREBETWEEN

CROSS-REFERENCE TO RELATED APPLICATIONS

This application is based upon and claims the benefit of priority from the prior Japanese Patent Application No. 2008-049715, filed on Feb. 29, 2008, and Japanese Patent Application No. 2009-027741 filed on Feb. 9, 2009, the entire contents of which are incorporated herein by reference.

BACKGROUND OF THE INVENTION

1. Field of the Invention

The present invention relates to a device mounting board and a manufacturing method therefor, a semiconductor module and a mobile apparatus carrying the same.

2. Description of the Related Art

In recent years, with miniaturization and higher performance in electronic devices, demand has been ever greater for further miniaturization of semiconductor devices used in the electronic devices. With such miniaturization of semiconductor devices, it is of absolute necessity that the pitch of electrodes to enable mounting on a wiring board be made narrower. A known method of surface-mounting a semiconductor device is flip-chip mounting in which solder balls are formed on electrodes of the semiconductor device and the solder balls are soldered to an electrode pad of the wiring board. With this flip-chip method, however, there are restrictive factors for the narrowing of the pitch of electrodes, such as the size of the solder ball itself and the bridge formation at soldering. As one structure used to overcome these limitations, known is a structure where a bump structure formed by half-etching a substrate is used as an electrode or a via, and the electrodes of the semiconductor device are connected to the bump structure by mounting the semiconductor device on the substrate with an insulating resin layer, such as epoxy resin, held between the semiconductor device and the substrate.

On the other hand, a semiconductor device is known where an electrode exposed in an opening formed in an insulating layer is provided. In this semiconductor device, a side wall of the insulating layer is located around the electrode.

In such a case of the aforementioned conventional practice where a bump electrode is connected to the semiconductor device where the side wall of the insulating layer is located around the electrode, the insulation layer around the electrode in a semiconductor device side may be an obstacle if the position of the bump electrode is displaced against the electrode in the semiconductor device side. If the position thereof is displaced, there may be cases where the electrode in the semiconductor device side does not come in contact with the bump electrode. To prevent this, the position of the semiconductor-device-side electrode and the bump electrode needs to be done more accurately. As a result, the manufacturing of semiconductor modules becomes more complex and the manufacturing cost increases.

SUMMARY OF THE INVENTION

The present invention has been made in view of the foregoing circumstances, and a general purpose thereof is to provide a technology for improving the connection reliability between electrodes and bump electrodes provided in a semiconductor device.

One embodiment of the present invention relates to a semiconductor device. This semiconductor device comprises: a semiconductor substrate; a device electrode formed on the semiconductor substrate; and a protective layer which covers the semiconductor substrate surrounding the device electrode, wherein a surface of the device electrode lies on the same plane as a surface of said protective layer, or the surface of the device electrode is protruded with respect to that of the protective surface.

By employing this embodiment, the presence of the protective layer surrounding the device electrode is no longer an obstacle if the bump electrode provided in a mounting board side is connected to the device electrode. Accordingly, even if a positional displacement occurs between the bump electrode and the device electrode, the device electrode and the bump electrode can be connected to each other and therefore the connection reliability between the device electrode and the bump electrode can be improved.

In the semiconductor device according to this embodiment, the device electrode, protruded with respect to the surface of the protective layer, may further covert the protective layer on the periphery of the device electrode.

According to this embodiment, the separation of the protective layer from the semiconductor substrate due to a thermal stress can be prevented.

The device electrode, protruded with respect to the surface of said protective layer, may have a flat portion in the surface thereof.

Also, the device electrode, protruded with respect to the surface of said protective layer, may have a flat portion in the surface thereof, and the flat portion may extend to a region covering the protective layer.

By employing this embodiment, the flat portion can be extended to the region that covers the protective layer. This allows a large margin for positional displacement and therefore the connection reliability in consideration of the positional displacement between the bump electrode and the device electrode can be improved.

Also, the device electrode may contain a metallic layer, comprised of an upper layer and a lower layer, on the outermost surface thereof. The device electrode may contain a metallic layer, comprised of an upper layer and a lower layer, on the outermost surface thereof, and the lower layer may cover the protective layer.

Another embodiment relates to a semiconductor module. This semiconductor module comprises: any one of the above-described semiconductor devices; an insulating layer; a wiring layer provided on one main surface of the insulating layer; and a device mounting board, electrically connected to the wiring layer, which has a bump electrode protruded from the wiring layer in an opposite side of the insulating layer, wherein the bump electrode and the device electrode of the semiconductor device are electrically connected to each other.

Still another embodiment of the present invention relates to a portable device. This portable device mounts the above-described semiconductor module.

Still another embodiment of the present invention relates to a method for manufacturing a semiconductor module. This method for manufacturing a semiconductor module comprises: preparing a semiconductor device wherein the semiconductor device is such that a surface of a device electrode formed on a semiconductor substrate lies on the same plane as the surface of a protective layer or the surface of the device electrode is protruded with respect to the surface of the protective layer; preparing a metallic sheet where a plurality of bump electrodes are provided in a protruding manner; placing the metallic sheet on one main surface of an insulating resin layer in such a manner that the bump electrodes face the insulating resin layer, and exposing the bump electrodes from the other main surface of the insulating resin layer by having the bump electrodes penetrating the insulating resin layer; placing the semiconductor device, provided with the device electrodes, on the other main surface of the insulating resin layer, and electrically connecting the bump electrodes to the device electrodes corresponding thereto; and forming a wiring layer by selectively removing the metallic sheet.

It is to be noted that any arbitrary combinations or rearrangement, as appropriate, of the aforementioned constituting elements and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
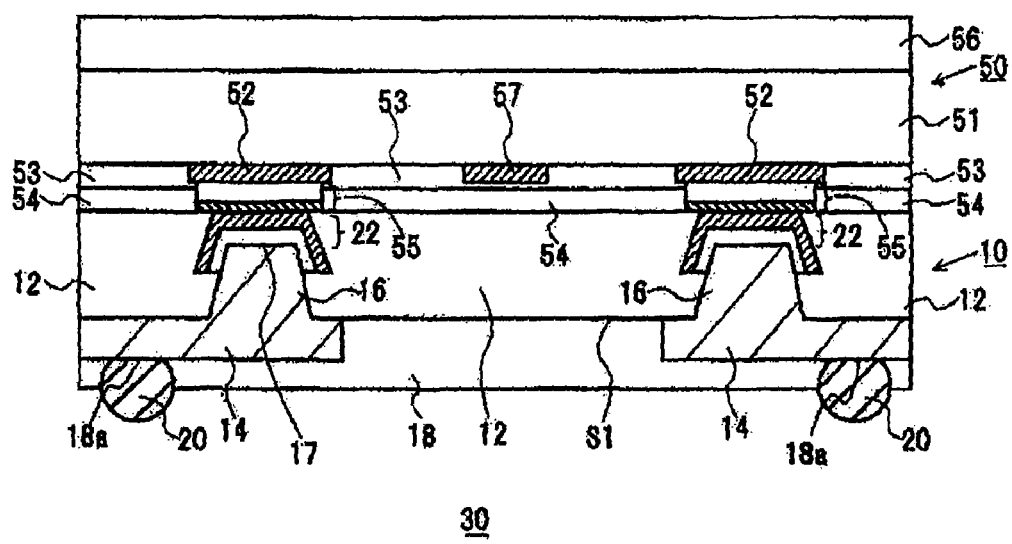
FIG. 1 is a schematic cross-sectional view showing a structure of a semiconductor device and a semiconductor module according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the same components and the description thereof is omitted as appropriate. Moreover, the embodiments given are for illustrative purposes only and all features and their combination thereof described in the present embodiment are not necessarily essential to the invention.

First Embodiment

FIG. 1 is a schematic cross-sectional view showing a structure of a semiconductor device 50 and a semiconductor module 30 according to a first embodiment of the present invention. The semiconductor module 30 includes a device mounting board 10 and a semiconductor device 50 mounted on the device mounting board 10.

The device mounting board 10 includes an insulating resin layer 12, a wiring layer 14 provided on one main surface S1 of an insulating resin layer 12, and a bump electrode 16, electrically connected to the wiring layer 14, which is protruded (projected) from the wiring layer 14 toward an insulating resin layer 12 side.

The insulating resin layer 12 is made of insulating resin and is formed of, for example, a material that develops plastic flow when pressurized. An example of the material that develops plastic flow when pressurized is epoxy thermosetting resin. The epoxy thermosetting resin to be used for the insulating resin layer 12 may be, for example, one having viscosity of 1 kPa·s under the conditions of a temperature of 160° C. and a pressure of 8 MPa. If a pressure of 5 to 15 MPa is applied to this epoxy thermosetting resin at a temperature of 160° C., then the viscosity of the resin will drop to about ⅛ of the viscosity thereof with no pressurization. In contrast to this, an epoxy resin in B stage before thermosetting has no viscosity, similarly to a case when the resin is not pressurized, under a condition that the temperature is less than or equal to a glass transition temperature Tg. And the epoxy resin develops no viscosity even when pressurized under a condition that the temperature is less than or equal to the glass transition temperature Tg. Also, this epoxy thermosetting resin is a dielectric substance having a permittivity of about 3 to 4.

The wiring layer 14 is provided on one main surface S1 of the insulating resin layer 12 and is formed of a conducive material, preferably of a rolled metal or more preferably of a rolled copper. Or the wiring layer 14 may be formed of electrolyte copper or the like. The bump electrode 16 is provided, in a protruding manner, on the insulating resin layer 12 side. In the present embodiment, the wiring layer 14 and the bump electrode 16 are formed integrally with each other and thereby the connection between the wiring layer 14 and the bump electrode 16 is assured. Moreover, the electrical connection between the bump electrode 16 and the device electrode 52 can be secured simultaneously when the wiring layer 14 is press-bonded, without adding the connection process by bonding wire or solders. Hence, an advantageous effect of not increasing the number of processes can be achieved. Note that the preferred embodiments are not particularly limited to the structure where the wiring layer 14 and the bump electrode 16 are formed integrally with each other. A protective layer 18 is provided on a main surface of the wiring layer 14 opposite to the insulating resin layer 12. This protective layer 18 protects the wiring layer 14 against oxidation or the like. The protective layer 18 may be a photo solder resist (hereinafter referred to as "PSR") layer, for instance. An opening 18a is formed in a predetermined position of the protective layer 18, and the wiring layer 14 is partially exposed there. A solder ball 20, which functions as an external connection electrode, is formed within the opening 18a. And the solder ball 20 and the wiring layer 14 are electrically connected to each other. The position in which the solder ball 20 is formed, namely, the area in which the opening 18a is formed is, for instance, an end where circuit wiring is extended through a rewiring.

The overall shape of the bump electrode 16 is narrower toward the tip portion thereof. In other words, the side surface of the bump electrode 16 is tapered. A metallic layer 22 is provided on a top surface 17 of the bump electrode 16. A Ni/Au plating layer is preferable as the metallic layer 22. The expression used here as "Ni/Au" indicates a structure where a Ni layer and an Au layer stacked on the Ni layer are stacked together.

The semiconductor device 50 is mounted on the device mounting board 10 having the above-described structure so as to form the semiconductor module 30. The semiconductor module 30 according to the first embodiment is structured such that a bump electrode 16 of the device mounting board 10 is electrically connected to a device electrode 52 of the semiconductor device 50 through the medium of the metallic layer 22 and the metallic layer 55.

The semiconductor device 50 has device electrodes 52 disposed counter to the semiconductor substrate 51 and the bump electrodes 16, respectively. An insulating layer 53 and an element protective layer 54, in which openings are provided so that the device electrodes 52 can be exposed from the openings, are stacked on the main surface of the semiconductor device 50 which is a side in contact with the insulating resin layer 12. A metallic layer 55 covers a surface of the device electrode 52. An alignment mark 57 is provided in a predetermined position of the semiconductor substrate 51. The alignment mark 57 may be covered by the insulating layer 53 as in this first embodiment as long as the alignment mark 57 is optically visible. In a modification of the first embodiment, the alignment mark 57 may be provided in the opening of the insulating layer 53 and the protective layer 54. Also, an insulating layer 56 is provided on the back side of the semiconductor substrate 51. It is to be note that the device electrode 52 and metallic layer 55 together may be simply called "device electrode" also.

In the first embodiment, the surface of the metallic layer 55 (device electrode) is disposed on the same plane as the surface of the protective layer 54.

A specific example of the semiconductor device 50 is a semiconductor chip such as an integrated circuit (IC) or a large-scale integrated circuit (LSI). A specific example of the insulating layer 53 is a silicon nitride film (hereinafter referred to as "SiN"). A specific example of the protective layer 54 is a polyimide layer, a PSR layer or the like. For example, aluminum (Al) is used as the device electrode 52. A Ni/Au plating layer is preferable as the metallic layer 55. A specific example of the insulating layer 56 is an epoxy resin film.

(Method for Manufacturing a Semiconductor Device and a Semiconductor Module)

A method for manufacturing a semiconductor device and a semiconductor module according to the first embodiment is now described.

Figure 2A:
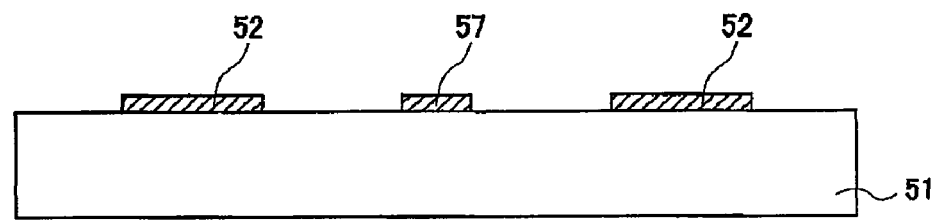
FIGS. 2A to 2C are cross-sectional views showing a process in a method for forming a semiconductor device.
Figure 2B:
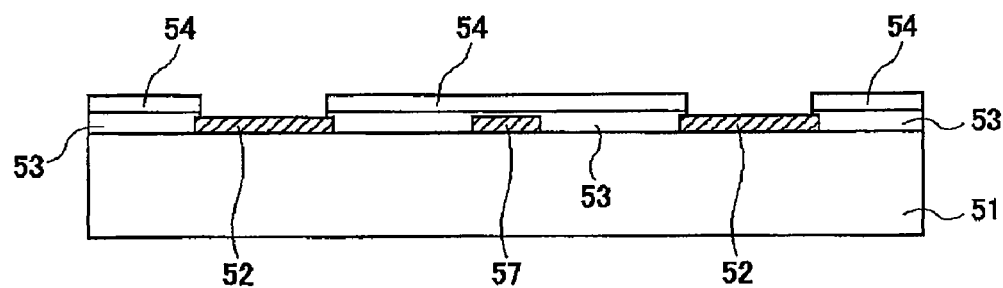
Figure 2C:
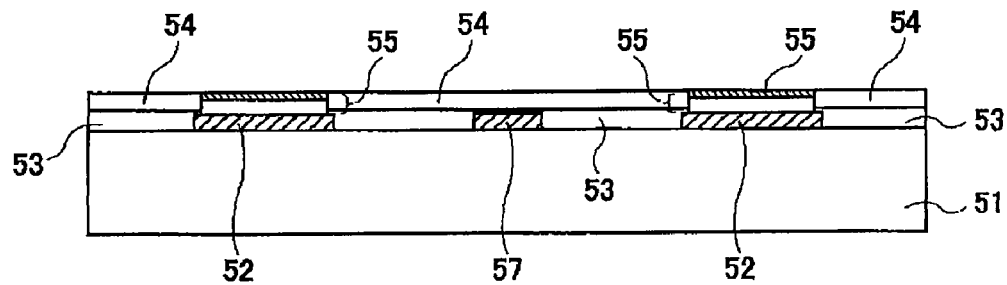

FIGS. 2A to 2C are cross-sectional views showing a process in a method for forming the semiconductor device.

As illustrated in FIG. 2A, a semiconductor substrate 51 on which a device electrode 52 constituting a part of a device electrode is prepared. The semiconductor substrate 51 is an Si substrate, for example, on which an integrated circuit (IC) or a large-scale integrated circuit (LSI) is formed. The device electrode 52 can be formed by patterning Al, for instance. An alignment mark 57 is provided in a predetermined position of the semiconductor substrate 51. The alignment mark 57 can be formed simultaneously when Al for use as the device electrode 52 is patterned, for instance. That is, in such a case the alignment mark 57 is formed of Al. However, it suffices if the alignment mark 57 is optically visible, and the alignment mark 57 may be formed using other materials or processes.

Then, as shown in FIG. 2B, an insulating layer 53 and a protective layer 54 are so formed as to cover the surface of the semiconductor substrate 51 around the device electrode 52, using a photoresist technique. For example, an SiN film may be used as the insulating layer 53. For example, polyimide may be used as the protective layer 18. The thickness of SiN film is about 1.5 µm, for instance. The thickness of polyimide, SPR or the like is about 3 µm, for instance.

Then, as shown in FIG. 2C, a metallic layer 55 comprised of a Ni/Au layer is formed on the device electrode 52 by electroless plating. Here, the thickness of the metallic layer 55 is adjusted so that the surface of the metallic layer 55 lies on the same plane as the surface of the protective layer 54 or the surface of the metallic layer 55 is protruded against that of said protective surface. Thus, the semiconductor device 50 is manufactured through processes as described above.

FIGS. 3A to 3D are cross-sectional views showing a process in a method for forming bump electrodes.

Figure 3A:
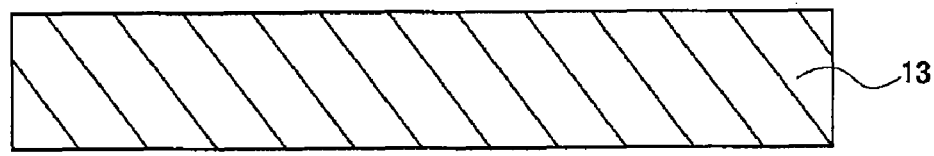
FIGS. 3A to 3D are cross-sectional views showing a process in a method for forming bump electrodes.

As illustrated in FIG. 3A, a copper sheet 13 is prepared as a metallic sheet having a thickness greater than at least the sum of the height of the bump electrode 16 and the thickness of the wiring layer 14 as shown in FIG. 1.

Figure 3B:
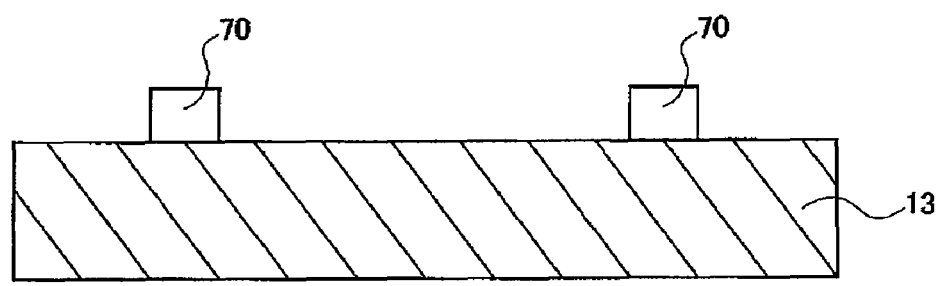

Then, as shown in FIG. 3B, resists 70 are formed selectively in alignment with a pattern of bump electrodes 16 using a lithography method. More specifically, a resist film of predetermined film thickness is affixed to the copper sheet 13 by a laminating apparatus, and it is then subjected to exposure using a photo mask having the pattern of bump electrodes 16. After this, the resists 70 are selectively formed on the copper sheet 13 by a development. To improve the adhesion of the resists 70 to the copper sheet 13, it is desirable that a pretreatment, such as grinding and cleaning, be performed as necessary on the surface of the copper sheet 13 before the lamination of the resist film thereon.

Figure 3C:
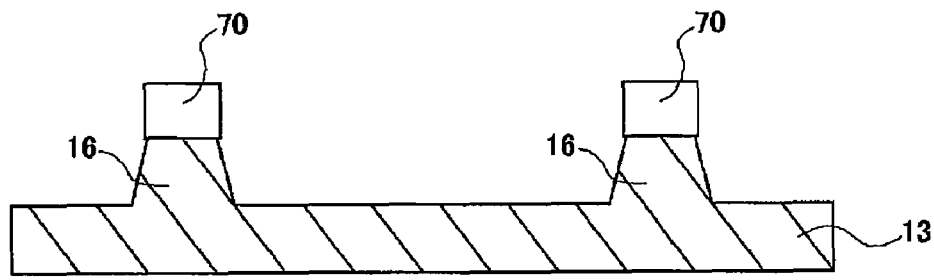

Then, as shown in FIG. 3C, bump electrodes 16 having a predetermined pattern are formed on the copper sheet 13 using the resists 70 as a mask.

Figure 3D:
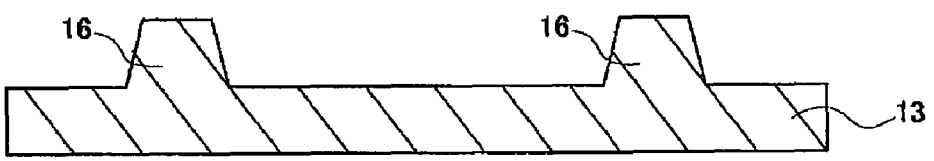

Then, as shown in FIG. 3D, the resists 70 are removed using a stripping agent. Thus the bump electrodes 16 are formed on the copper sheet 13 through a process as described above. The diameter of the base, the diameter of the top, and the height of the bump electrode 16 according to the first embodiment are 100 to 140 µmϕ, 50 µmϕ, and 30 µmϕ, respectively, for instance.

FIGS. 4A to 4D are cross-sectional views showing a process in a method for forming metallic layers on the top surfaces of bump electrodes.

Figure 4A:
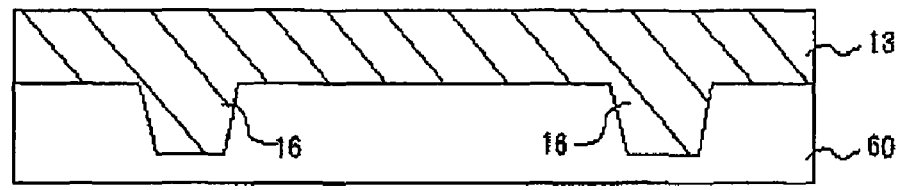
FIGS. 4A to 4D are cross-sectional views showing a process in a method for forming metallic layers on the top surfaces of bump electrodes.

As shown in FIG. 4A, a gold-resistant resist 60 are stacked on the copper sheet 13 in a side where the bump electrodes are formed, using the laminating apparatus.

Figure 4B:
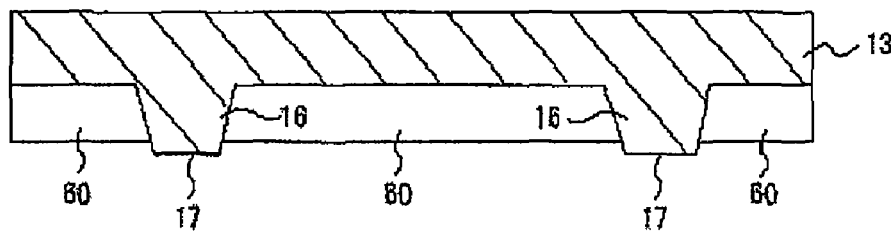

Then, as shown in FIG. 4B, the gold-resistant resist 60 is turned into thin film by the use of $O_2$ plasma etching so that the top surface 17 of the bump electrode 16 and part of the tapered portion thereof are exposed.

Figure 4C:
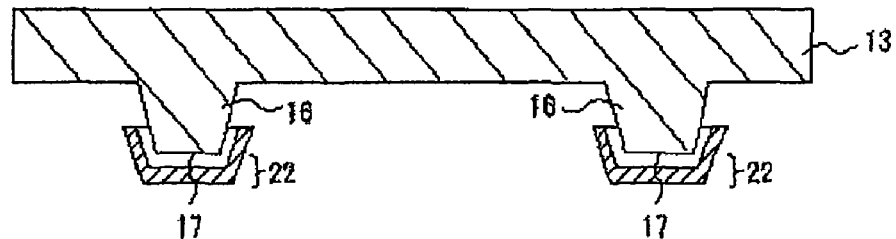

Then, as shown in FIG. 4C, a metallic layer 22 comprised of a Ni/Au layer is formed on the top surface of the bump electrode 16 by electroless plating. After the formation of this metallic layer 22, the gold-resistant resist 60 is removed.

Figure 4D:
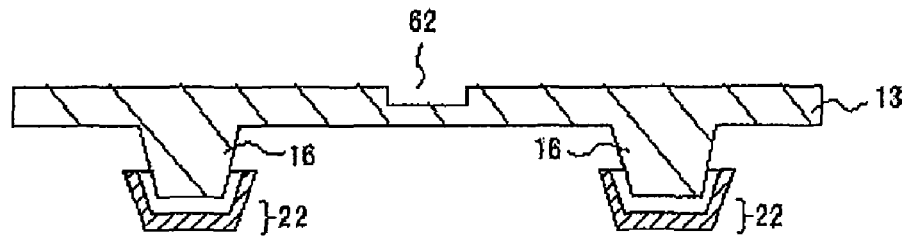

Then, as shown in FIG. 4D, the surface of the copper sheet 13 in a side opposite to the side where the bump electrodes 16 are provided is etched back and the copper sheet 13 is turned into thin film thereby. Then, a recess 62 serving as the alignment mark is formed by etching a predetermined region of the copper sheet 13 using a not-shown resist.

Figure 5A:
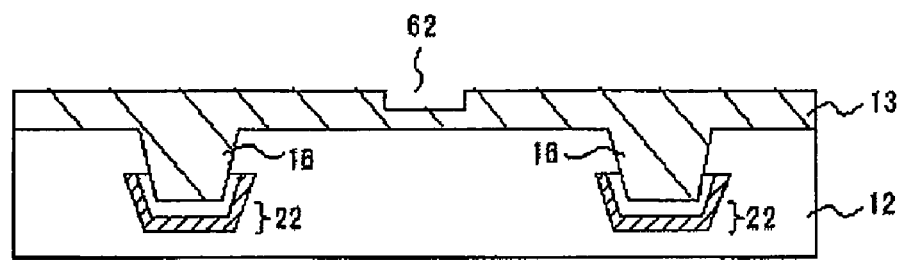
FIGS. 5A and 5B are cross-sectional views showing a process in a method for exposing heads of bump electrodes.
Figure 5B:
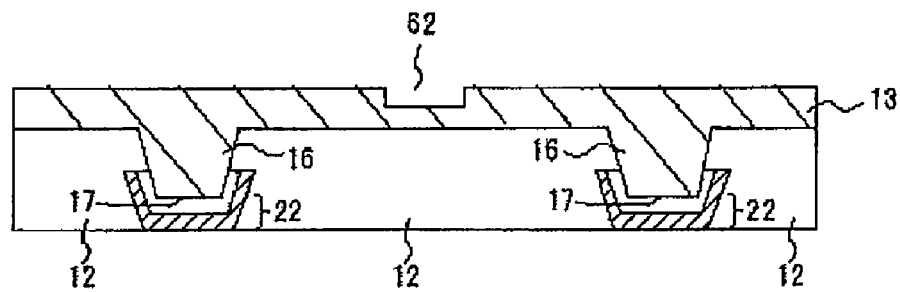

FIGS. 5A and 5B are cross-sectional views showing a process in a method for exposing heads of bump electrodes.

As shown in FIG. 5A, an insulating resin layer 12 is stacked on the surface of the copper sheet 13 in the side where the bump electrodes 16 are provided, using a vacuum laminating method. For example, an epoxy thermosetting resin can be used as the insulating resin layer 12.

Then, as shown in FIG. 5B, the insulating resin layer 12 is turned into thin film by the use of $O_2$ plasma etching so that the metallic layer 22 provided on the top surface 17 of the bump electrode 16 is exposed. In this first embodiment, Au is exposed as the surface of the metallic layer 22.

Figure 6A:
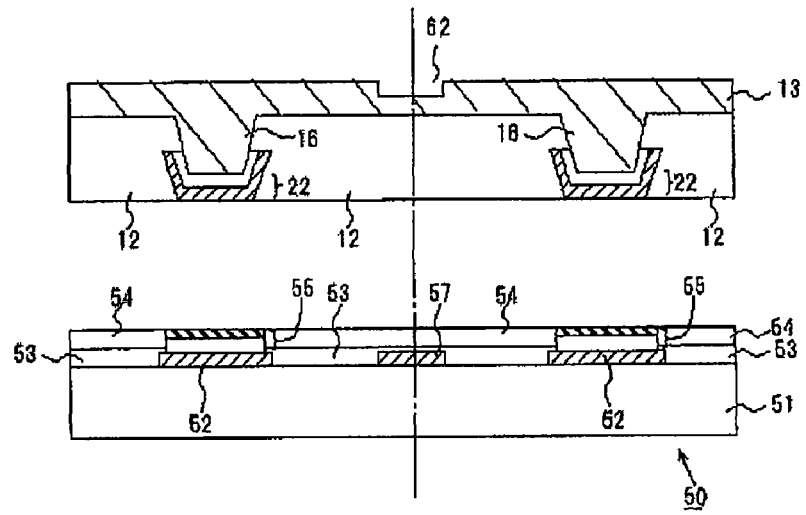
FIGS. 6A to 6C are cross-sectional views showing a process in a method for pasting together a semiconductor device and a device mounting board on which a semiconductor device and bump electrodes are provided.
Figure 6B:
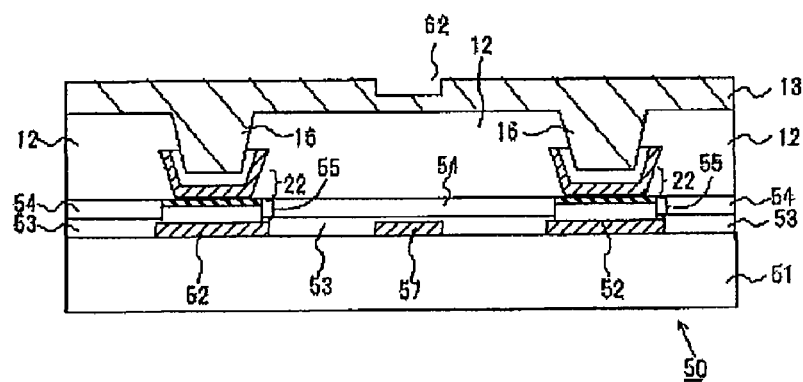
Figure 6C:
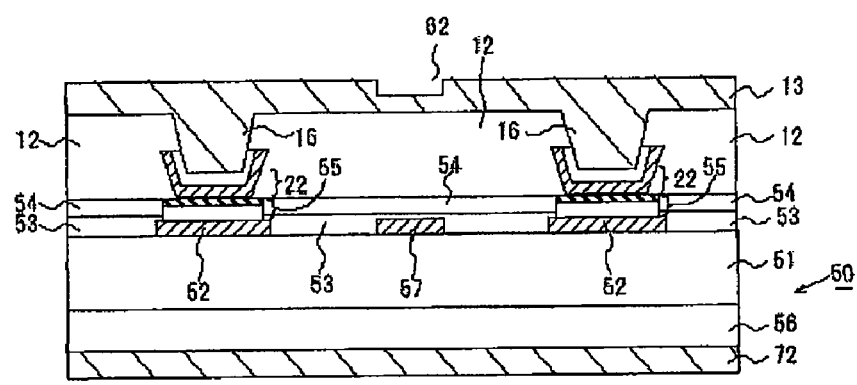

FIGS. 6A to 6C are cross-sectional views showing a process in a method for pasting together a semiconductor device and a device mounting board on which a semiconductor device and bump electrodes are provided.

As shown in FIG. 6A, the positions of the recess 62 provided in the copper sheet 13 and the alignment mark 57 provided on the semiconductor substrate 51 are adjusted by using an alignment apparatus or the like.

Then, as shown in FIG. 6B, the insulating resin layer 12 and the semiconductor device 50 are temporarily bonded in a central part of the copper sheet 13 which is a region where the recess 62 is provided.

Then, as shown in FIG. 6C, an insulating layer 56 with a copper foil 72 is pasted on the back side of the semiconductor device 50 and, at the same time, the insulating resin layer 12, the metallic layer 22 and the semiconductor device 50 are pasted together by vacuum press bonding. In the first embodiment, Au—Au bonding occurs between the metallic layer 22 provided on the bump electrode 16 in the device mounting board 10 side and the metallic layer 55 provided on the device electrode 52 in the semiconductor device 50 side. Accordingly, golds, which are relatively soft metal, are joined together. Since the insulating layer 56 having the copper foil 72 is bonded to the back side of the semiconductor device 50, the warping of the copper sheet 13 caused by the heating of adhesion resin at the time when the semiconductor device and the device mounting board are pasted together is canceled out by the warping of the copper foil 72. As a result, the occurrence of the warping can be prevented as a whole. It is desirable that the thickness of the copper foil 72 is the same as that of the copper sheet 13.

Figure 7A:
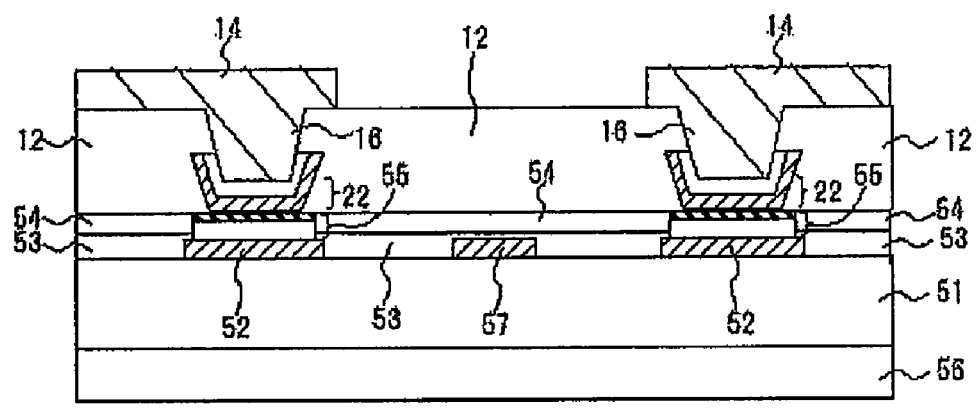
FIGS. 7A and 7B are cross-sectional views showing a rewiring process.
Figure 7B:
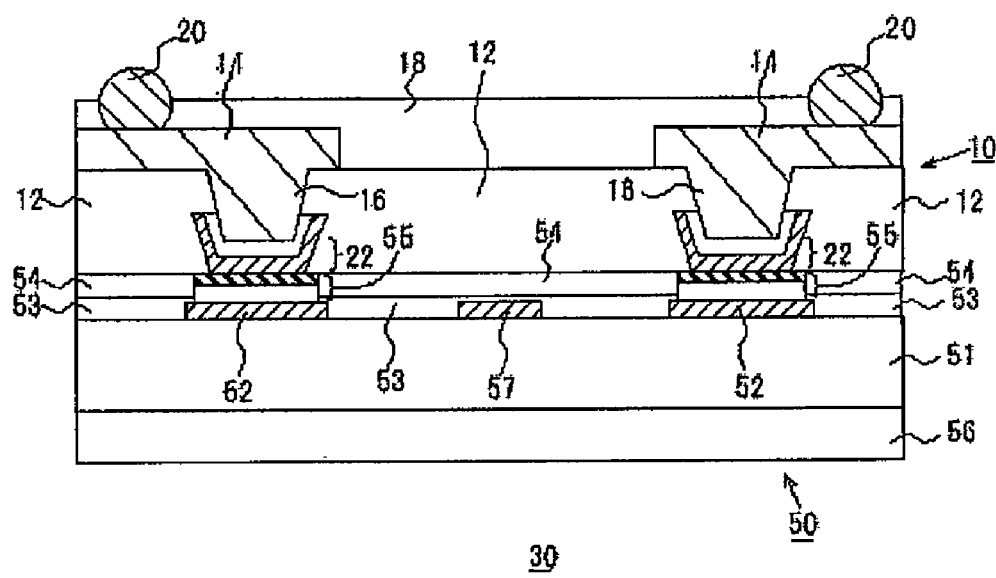

FIGS. 7A and 7B are cross-sectional views showing a rewiring process.

Then, as shown in FIG. 7A, the copper sheet 13 is selectively removed by using a photolithography method and an etching method so as to form a wiring layer 14 (hereinafter referred to as "rewiring layer" also). At the same time, the copper foil 72 affixed to the insulating layer 56 is also removed.

Then, as shown in FIG. 7B, a protective layer (photo solder resist layer) 18 is stacked on the wiring layer 14 and the insulating resin layer 12. Then, openings are provided in predetermined regions (mounting regions of solder balls) of the protective layer 18 by using the photolithography method, and the solder balls 20 are mounted in these openings by using a screen printing method.

Thus, the semiconductor module 30 is manufactured through processes as described above. If the above-described processes are to be done at a wafer level, a semiconductor wafer is diced into individual modules.

According to the processes, when the device electrodes 52 provided on the semiconductor device 50 are bonded to the device mounting board where the bump electrodes 16 are formed, by using a bonding method, they can be electrically bonded together without being disturbed by the presence of the protective layer 54 located on a side wall of the device electrode 52 in the semiconductor device 50 side even if the bump electrode 16 is positioned in an end of the device electrode 52 in the semiconductor device 50 side.

For this reason, the degree of accuracy required by the alignment as shown in FIG. 6A is low, so that the alignment apparatus can be simplified and the time required for an alignment operation can be shortened.

Since the connection reliability between the device electrode 52 and the bump electrode 16 in the semiconductor device 50 side is enhanced, the reliability of the semiconductor module 30 is improved. Also, the manufacturing yield of the semiconductor modules 30 can be improved and therefore the manufacturing cost of the semiconductor module 30 can be reduced.

Second Embodiment

Figure 8:
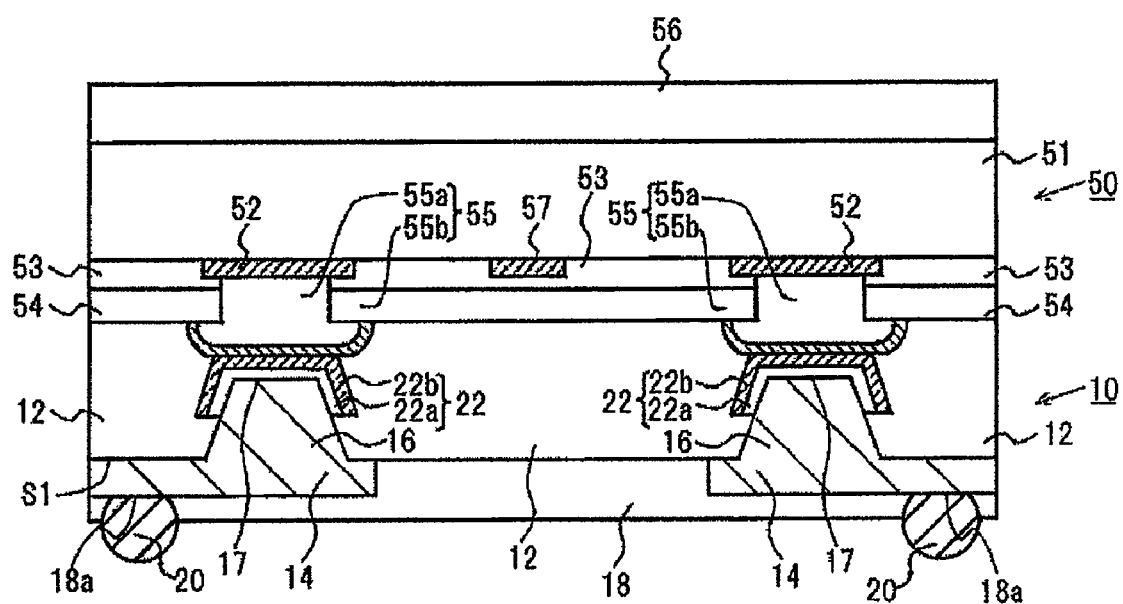
FIG. 8 is a cross-sectional view showing a structure of a semiconductor device according to a second embodiment of the present invention.

FIG. 8 is a cross-sectional view showing a structure of a semiconductor device 50 and a semiconductor module 30 according to a second embodiment of the present invention. The semiconductor module 30 includes a device mounting board 10 and a semiconductor device 50 mounted on the device mounting board 10. The second embodiment differs from the first embodiment in that the metallic layer 55 formed on the device electrode 52 disposed counter to the semiconductor substrate 51 and the bump electrode 16, respectively, are protruded with respect to the surface of the protective layer 54 in the semiconductor device 50. Further, the second embodiment differs from the first embodiment in that the metallic layer 55 covers a surface of the protective layer 54 on the periphery of the metallic layer.

According to the second embodiment, the structure is such that the metallic layer 55 covers a part of the surface of the protective layer 54 on the periphery of the metallic layer 55. With this structure, the protective layer 54 is pressed hard from above and therefore the separation of the protective layer 54 can be prevented. In other words, if the protective layer 54 is not covered with the metallic layer 55 as in the conventional practice, a separation will occur across an interface between the protective layer 54 and the semiconductor device 51 (or their boundary faces in the case of a plurality of protective layers 54). However, according to the second embodiment where the protective layer 54 is covered with the metallic layer 55, if the separation should occur at the interface, it can be prevented from spreading any farther and the growth of the separation can be eventually stopped. Hence, the separation of the protective layer 54 can be prevented.

A method for manufacturing a semiconductor module according to the second embodiment is now described.

FIGS. 9A to 9E are cross-sectional views showing a process in a method for forming a semiconductor device.

Figure 9A:
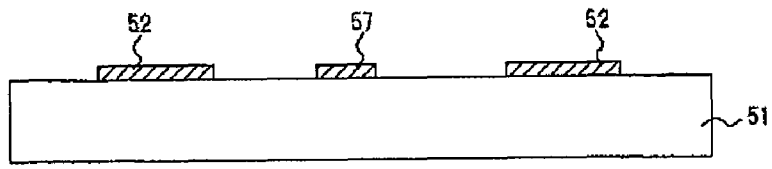
FIGS. 9A to 9E are cross-sectional views showing a process in a method for forming a semiconductor device.
Figure 9B:
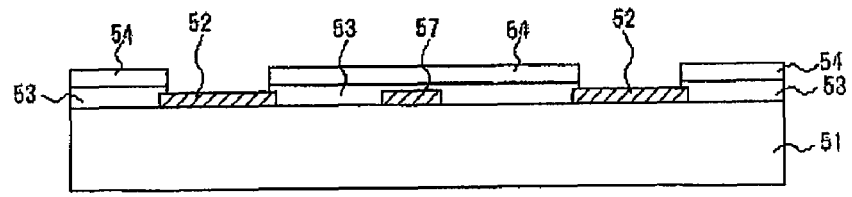

First, the process shown in FIGS. 9A and 9B in the method for forming a semiconductor device is the same as that shown in FIGS. 2A and 2B. Thus, the detailed description thereof is omitted here.

Figure 9C:
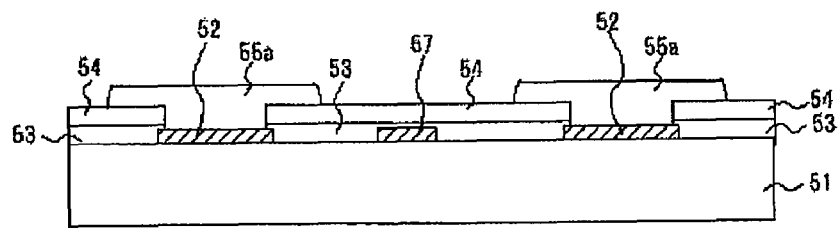

Then, as shown in FIG. 9C, an Ni layer 55a is plated on the device electrode 52 by electroless plating so that the Ni layer 55a is deposited thereon in a position higher than the surface of the protective layer 54 and the Ni layer 55a also covers the surface of the protective layer 54. Since the plating film grows isotropically in the upper (thickness) direction and the lateral (width) direction, the Ni layer 55a is deposited thereon in such a manner that the thickness thereof from the surface of the protective layer 54 has the height of 3 to 5 μm. Then, the surface of the Ni layer 55a is polished by a CMP (Chemical Mechanical Polishing) method so that the height of a part of the Ni layer 55 from the surface of the protective layer 54 is about 1 to 1.2 µm.

Figure 9D:
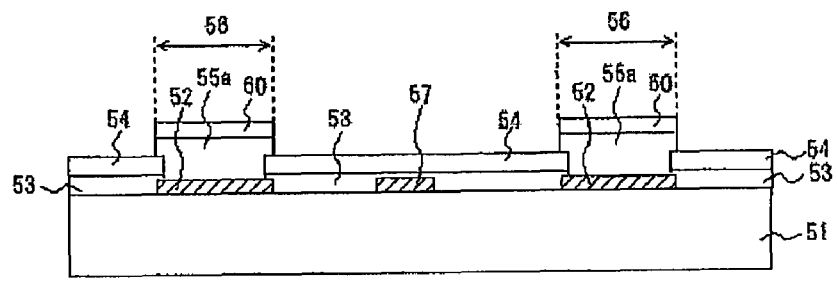

Then, as shown in FIG. 9D, a resist film 60 is formed on the Ni layer 55a in such a manner that a flat portion 56 of the Ni layer 55a overlaps partially with the protective layer 54 in a range of about 1.5 to 2 µm. Then, the Ni layer 55a is etched using the resist film 60 as a mask. As a result, the flat portion 56 of the Ni layer 55a remains.

Figure 9E:
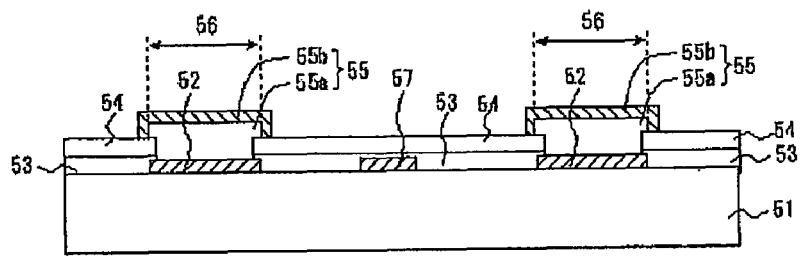

As shown in FIG. 9E, after the resist film 60 is removed, an Au layer 55b is deposited by electroless plating in the thickness of about 0.5 µm in such a manner as to cover the Ni layer 55a. As a result, a structure can be achieved where the flat portion 56 of the metallic layer 55 covers the protective layer 54 in the range of about 2 to 2.5 µm.

As shown in FIGS. 6A to 6C, the semiconductor device fabricated as above is aligned and bonded to the device mounting board where the bump electrodes shown in FIGS. 5A and 5B are provided.

Note that the following arrangement may also be implemented. That is, the flat portion 56 of the Ni layer 55a may covert the surface of the protective layer 54 without the use of the resist 60. More specifically, the thickness of the plated Ni layer 55a is grown up to the thickness of about 2 to 2.5 µm (i.e., the surface of the protective film 54 is also grown laterally to about 2 to 2.5 µm). Then, the surface of the metallic layer 55 is polished by the CMP method in the range of about 1 to 1.3 µm so as to cover the surface of the protective layer 54 with the metallic layer 55. As a result, a metallic film 55 can be obtained where the thickness of the Ni layer 55a in the flat portion 56 is about 1 to 1.2 µm.

Figure 10:
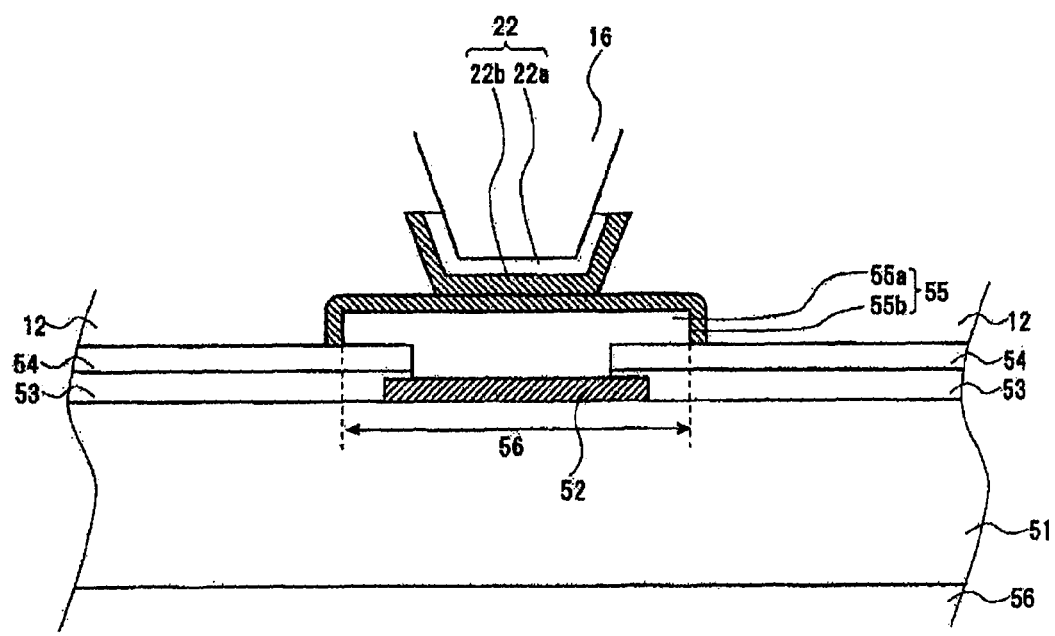
FIG. 10 is a partially exploded cross-sectional view showing a structure of a semiconductor device.

Referring to FIG. 10, a description is now given of a state of electrical connection between the metallic layer 55 and the bump electrode 16.

If the metallic film 55 and the bump electrode 16 are to be electrically connected to each other, the bump electrode 16 must primarily be connected to the metallic layer 55 as shown in FIG. 10. In this arrangement, the metallic layer 55 also covers the protective layer 54, and the flat portion 56 extends over the protective layer 54. With this structure and arrangement, even if the position of the bump electrode 16 is displaced to the right or left in FIG. 10, a connection area can be assured and therefore the bump electrode 16 and the metallic film 55 can be reliably connected to each other.

In this manner, the metallic layer and the bump electrode can be electrically connected to each other without fail, so that the connection reliability of the semiconductor module can be improved.

Figure 11:
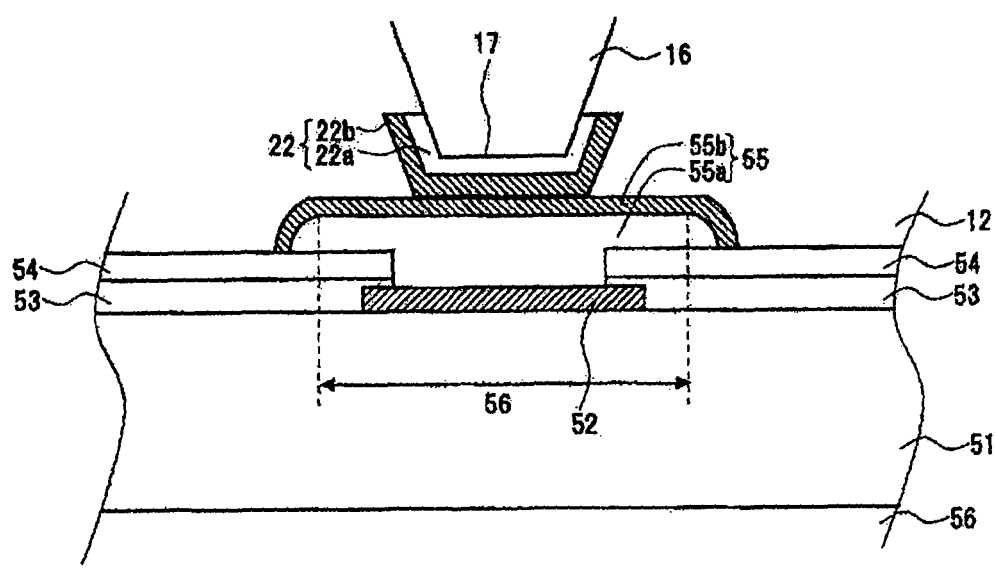
FIG. 11 is a partially exploded cross-sectional view showing a structure of a semiconductor device.

FIG. 11 illustrates a modification of the connection structure where the bump electrode 16 is connected to the metallic layer 55 having the flat portion 56.

This structure as shown in FIG. 11 is obtained by forming the Au layer 55b in the surface region of the Ni layer 55a by electroless plating after completing the process shown in FIG. 9C.

Then, as shown in FIG. 11, the metallic layer 55 covers a partial surface of the protective layer 54 with the Ni layer 55a and the Au layer 55b. The cross section at ends of the metallic layer 55 is of a circular shape, and the metallic layer 55 has the flat portion 56. This flat portion 56 and the bump electrode 16 whose top 17 is covered with the Ni layer 22a and the Au layer 22b are electrically connected to each other.

As another modification, in FIG. 9C the plating thickness of the Ni layer 55a may be made thinner and the Au layer 55b may be deposited on the Ni layer 55a by electroless plating without using the CMP method.

Third Embodiment

Next, a description will be given of a mobile apparatus (portable device) provided with a semiconductor module according to the above described embodiments. The mobile apparatus presented as an example herein is a mobile phone, but it may be any electronic apparatus, such as a personal digital assistant (PDA), a digital video cameras (DVC) or a digital still camera (DSC).

Figure 12:
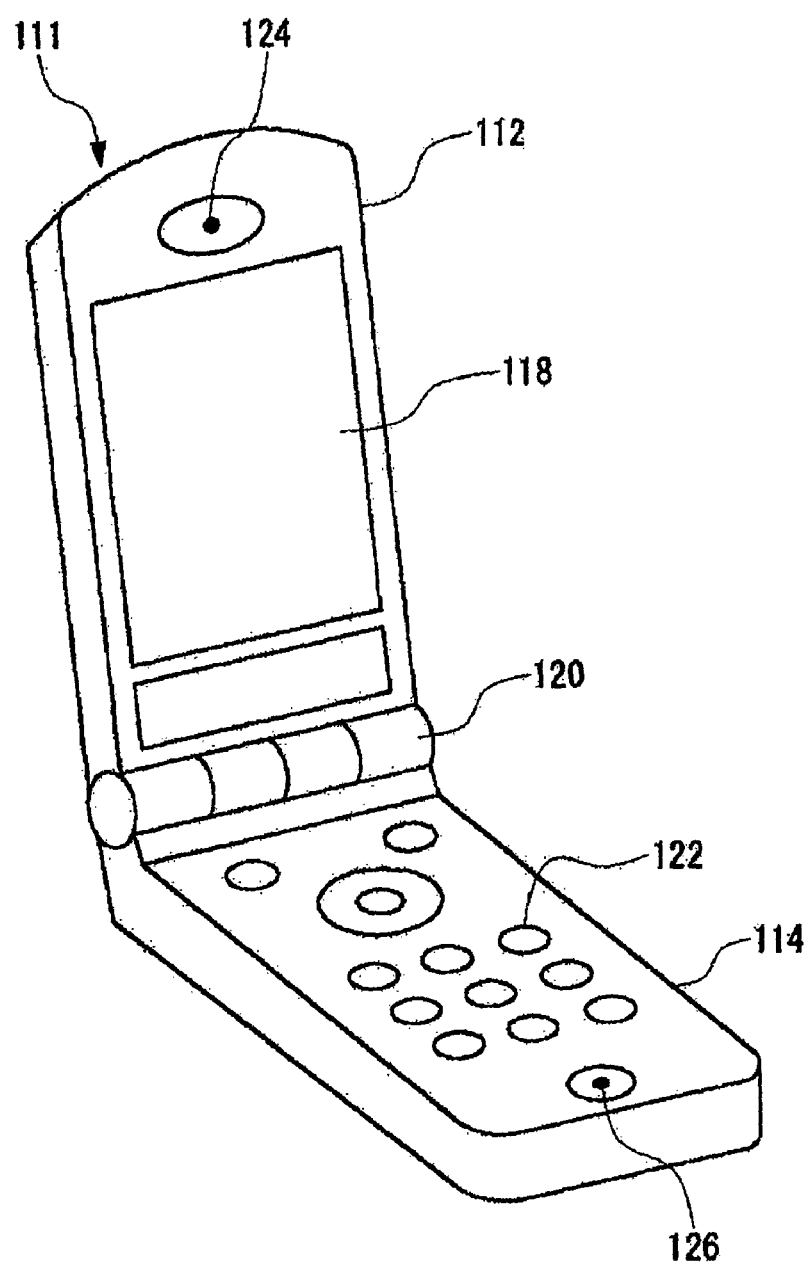
FIG. 12 illustrates a structure of a mobile phone according to a third embodiment of the present invention.

FIG. 12 illustrates a structure of a mobile phone provided with a semiconductor module 30 according to the preferred embodiments of the present invention. A mobile phone 111 has a structure of a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and a microphone 126. Note that the semiconductor module 30 according to each of the above embodiments of the present invention is mounted within a mobile phone 111 such as this.

Figure 13:
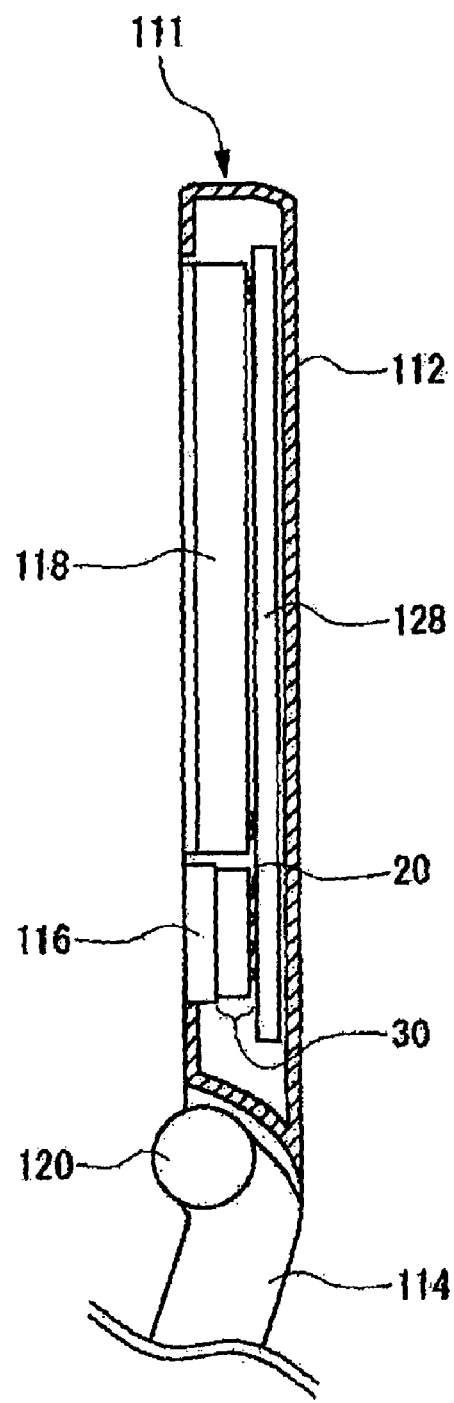
FIG. 13 is a partial cross-sectional view of a mobile phone.

FIG. 13 is a partially schematic cross-sectional view (cross-sectional view of a first casing 112) of the mobile phone shown in FIG. 12. The semiconductor module 10 according to each of the above-described embodiments is mounted on a printed circuit board 128 via the solder balls 20 and is coupled electrically to the display unit 118 and the like by way of the printed circuit board 128. Also, a radiating substrate 116, which may be a metallic substrate or the like, is provided on the back side of the semiconductor module 30 (opposite side of solder balls 20), so that the heat generated from the semiconductor module 30, for example, can be efficiently released outside the first casing 112 without getting trapped therein.

By employing the semiconductor module 30 according to the embodiments of the present invention, the reliability of mounting the semiconductor module 30 on a printed wiring board improves. Thus, the reliability as to a portable device provided with such a semiconductor module 30 improves.

The present invention is not limited to the above-described embodiments only, and it is understood by those skilled in the art that various modifications such as changes in design may be made based on their knowledge and the embodiments added with such modifications are also within the scope of the present invention.

For example, in the above-described embodiments, the wiring layer of the device mounting board has a single layer but this should not be considered as limiting and it may be multilayered.

In the above-described embodiment, the bump electrode 16 of the device mounting board 10 and the device electrode 52 of the semiconductor device 50 are electrically connected to each other through the Au—Au bonding but they may be electrically connected to each other through Au—Sn (gold-tin) boding instead.

The structure according to the above-described embodiments is applicable to a process for fabricating semiconductor packages, which is called a wafer-level CSP (Chip Size Package) process. By employing such a technique, the semiconductor module can be made thinner and smaller.

While the preferred embodiments of the present invention and their modifications have been described using specific terms, such description is for illustrative purposes only, and it is to be understood that changes and variations may further be made without departing from the spirit or scope of the appended claims.

What is claimed is:

1. A semiconductor module, comprising:
    a semiconductor device comprising:
        a semiconductor substrate;
        a device electrode formed on said semiconductor substrate, the device electrode having a first surface facing the semiconductor substrate and a second surface opposite to the first surface; and
        a protective layer, having an opening, covering said semiconductor substrate and allowing the device electrode to protrude from said protective layer through the opening; and
    a device mounting board comprising:
        an insulating resin layer provided on the protective layer, the insulating resin layer having a first surface facing the protective layer and a second surface opposite to the first surface;
        a wiring layer provided on the second surface of said insulating resin layer; and
        a bump electrode extending from said wiring layer and being provided in the insulating resin layer, wherein
    the device electrode is substantially symmetrical in a cross-sectional view in relation to a center axis of the opening in the protective layer,
    a portion of the device electrode which protrudes from the protective layer is provided in the insulating resin layer, and
    the bump electrode and the device electrode are electrically connected to each other in the insulating resin layer.

2. A semiconductor module according to claim 1, wherein said device electrode is protruded with respect to a surface of said protective layer, and covers said protective layer by a periphery of said device electrode.

3. A semiconductor module according to claim 2, wherein a top of the bump electrode and the device electrode are covered by metals of the same kind and coupled together by the metals.

4. A semiconductor module according to claim 1, wherein a top of the bump electrode and the device electrode are covered by metals of the same kind and coupled together by the metals.

5. The semiconductor module according to claim 1, wherein said device electrode of the semiconductor device is protruded with respect to a surface of said protective layer and has a surface with a flat portion thereof.

6. The semiconductor module according to claim 5, wherein the flat portion extends to a region covering the protective layer.

7. The semiconductor module according to claim 1, wherein said device electrode contains a metallic layer comprising an upper layer and a lower layer, on the outermost surface thereof.

8. The semiconductor module according to claim 1, wherein said device electrode contains a metallic layer comprising an upper layer and a lower layer, on the outermost surface thereof, and
    the lower layer covers said protective layer.

9. The semiconductor module according to claim 1, wherein the portion of the device electrode which protrudes from the protective layer has a rounded edge.

* * * * *